(12) United States Patent
Cho et al.

(10) Patent No.: US 8,906,775 B2
(45) Date of Patent: Dec. 9, 2014

(54) SEMICONDUCTOR DEVICE AND METHOD FOR FABRICATING THE SAME

(71) Applicant: SK Hynix Inc., Gyeonggi-do (KR)

(72) Inventors: Heung-Jae Cho, Gyeonggi-do (KR);
Eui-Seong Hwang, Gyeonggi-do (KR);
Tae-Yoon Kim, Gyeonggi-do (KR);
Kyu-Hyung Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/717,512

(22) Filed: Dec. 17, 2012

(65) Prior Publication Data

US 2014/0097519 A1    Apr. 10, 2014

(30) Foreign Application Priority Data

Oct. 10, 2012 (KR) .................. 10-2012-0112486

(51) Int. Cl.
| | |
|---|---|
| H01L 21/30 | (2006.01) |
| H01L 29/02 | (2006.01) |
| H01L 49/02 | (2006.01) |
| H01L 21/18 | (2006.01) |
| H01L 27/108 | (2006.01) |

(52) U.S. Cl.
CPC .......... *H01L 29/02* (2013.01); *H01L 27/10855* (2013.01); *H01L 27/10885* (2013.01); *H01L 28/40* (2013.01); *H01L 27/10814* (2013.01); *H01L 21/185* (2013.01); *H01L 27/10891* (2013.01)

USPC ..... 438/455; 438/458; 438/459; 257/E21.567

(58) Field of Classification Search
CPC ................... H01L 21/76254; H01L 27/10885
USPC .................. 438/455, 458, 459; 257/E21.567
See application file for complete search history.

(56) References Cited

U.S. PATENT DOCUMENTS

| | | | |
|---|---|---|---|
| 7,776,715 B2 * | 8/2010 | Wells et al. .................... | 438/455 |
| 7,842,600 B2 * | 11/2010 | Yun et al. ...................... | 438/619 |
| 2012/0080725 A1 * | 4/2012 | Manos et al. ................. | 257/208 |
| 2012/0108034 A1 * | 5/2012 | Bae et al. ...................... | 438/458 |

FOREIGN PATENT DOCUMENTS

| | | |
|---|---|---|
| KR | 101003542 | 12/2010 |
| KR | 1020120003204 | 1/2012 |
| KR | 1020130065264 | 6/2013 |

* cited by examiner

*Primary Examiner* — Julia Slutsker
(74) *Attorney, Agent, or Firm* — IP & T Group LLP

(57) ABSTRACT

A method for fabricating a semiconductor device includes forming a first semiconductor wafer, in which a circuit part and a first bonding layer are stacked, on a first semiconductor substrate, forming a second semiconductor wafer, which includes structures and an insulating layer for gap-filling between the structures, on a second semiconductor substrate, the structures including a pillar and bit lines stacked therein, bonding the first semiconductor wafer with the second semiconductor wafer so that the first bonding layer faces the insulating layer, and separating the second semiconductor substrate from the bonded second semiconductor wafer.

15 Claims, 10 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2012-0112486, filed on Oct. 10, 2012, which is incorporated herein by reference in its entirety.

BACKGROUND

1. Field

Exemplary embodiments of the present invention relate to a semiconductor fabrication technology, and more particularly, to a semiconductor device having an air gap between bit lines and a method for fabricating the same.

2. Description of the Related Art

With the rapid development of a semiconductor technology and the high density requirements, various types of technologies for bonding and stacking wafers have been developed. According to these technologies, a new wafer is bonded on a wafer substrate having elements, and other elements are formed subsequently.

Recently, there has been employed a technology of bonding a wafer, in which N/P/N/P layers have been stacked, on a metalized wafer, patterning the NPN layers in a subsequent process, and forming elements.

In order to form the wafer in which the N/P/N/P layers have been stacked, there is a method for ion implanting N-type impurities and P-type impurities into a substrate at different depths. However, in the case of forming the N/P/N/P layers using only ion implantation, ion implantation energy and a dose amount are increased substantially in order to form impurity layers at the lower portion of the substrate. Furthermore, in heat treatment for activating dopants after the ion implantation, impurities between layers are diffused, so that the N/P/N/P layers are not distinguished from one another.

In order to solve the concern, there has been proposed a method for forming two of the N/P/N/P layers by ion-implanting impurities into the substrate and forming the other two layers through single crystalline growth. However, this method has concerns that processes are complicated and process cost is high. Furthermore, since a growth thickness of a single crystalline layer should be thick, the method is disadvantageous in terms of cost, and does not completely solve the concerns due to the ion implantation.

Meanwhile, with an increase in the degree of integration of elements, parasitic capacitance between bit lines is increased, so that the reliability of the elements is reduced.

SUMMARY

Exemplary embodiments of the present invention are directed to provide a reliable semiconductor device.

Exemplary embodiments of the present invention are directed to provide a method for fabricating a semiconductor device, capable of lowering the degree of process difficulty of NPN layers for forming elements and of reducing parasitic capacitance between bit lines.

In accordance with an embodiment of the present invention, a method for fabricating a semiconductor device includes forming a first semiconductor wafer, in which a circuit part and a first bonding layer are stacked, on a first semiconductor substrate, forming a second semiconductor wafer, which includes structures and an insulating layer for gap-filling between the structures, on a second semiconductor substrate, the structures including a pillar and bit lines stacked therein, bonding the first semiconductor wafer with the second semiconductor wafer so that the first bonding layer faces the insulating layer, and separating the second semiconductor substrate from the bonded second semiconductor wafer.

In accordance with another embodiment of the present invention, a semiconductor device includes a circuit part including a first bonding layer, and a cell part including an insulation layer contacting with the first bonding layer, wherein the cell part comprises bit lines, and a cell transistor having a junction region connected to the bit lines.

DETAILED DESCRIPTION

Figure 1:
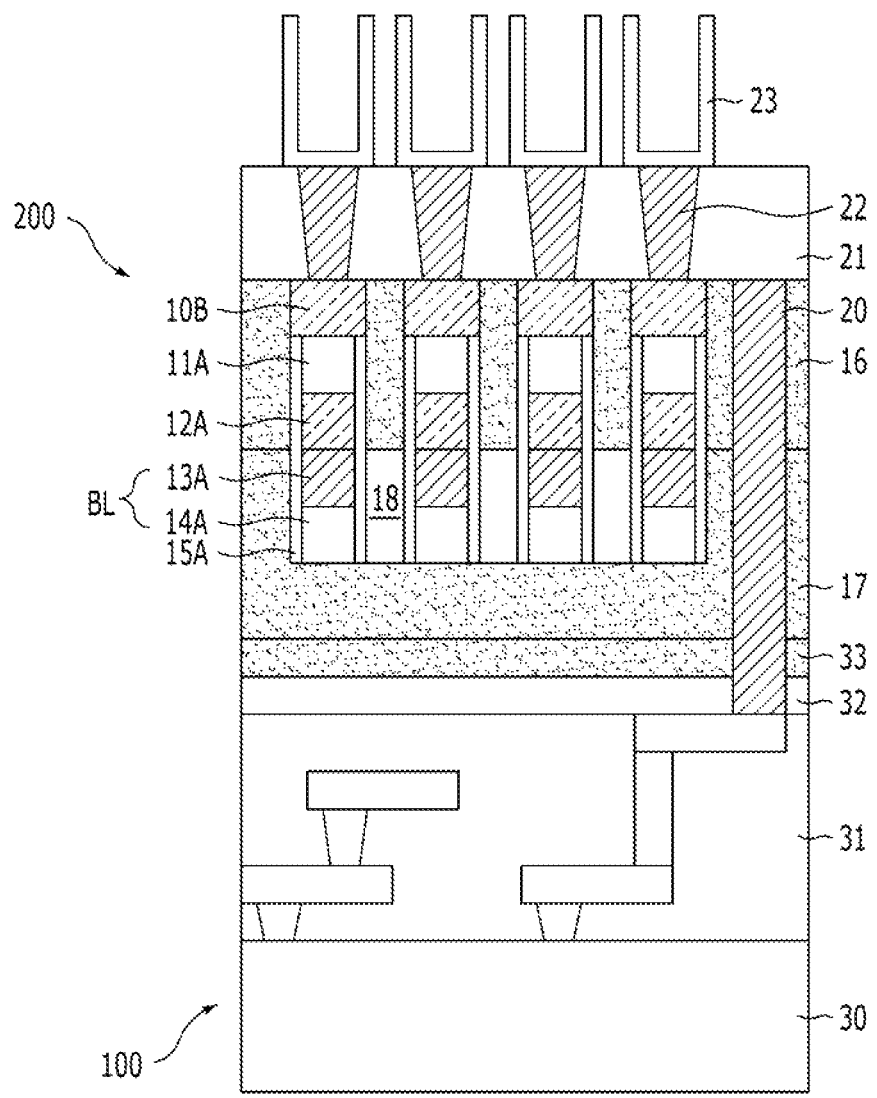
FIG. 1 is a sectional view illustrating an example of a semiconductor device in accordance with the present embodiment.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. In this specification, 'connected/coupled' represents that one component is directly coupled to another component or indirectly coupled through another component. In this specification, a singular form may include a plural form as long as it is not specifically mentioned in a sentence.

The drawings are not necessarily to scale and in some instances, proportions may have been exaggerated in order to dearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

FIG. 1 is a sectional view illustrating an example of a semiconductor device in accordance with the present embodiment.

As illustrated in FIG. 1, a semiconductor device is formed, in which a cell part including an insulation layer making contact with first bonding layers 32 and 33 of a circuit part including the first bonding layers 32 and 33 has been stacked.

The circuit part may include peripheral circuits, interconnections and the like.

The cell part may include bit lines BL and cell transistors having junction regions connected to the bit lines. Furthermore, the cell part may include an air gap 18 between the bit lines. In the present embodiment, a second insulation layer 17 contacts with the first bonding layer 33. However, in another embodiment, instead of the second insulation layer 17, a second bonding layer (not illustrated) bonded to the first bonding layers 32 and 33 may be additionally formed on the second insulation layer 17.

The bit line BL may include a stack structure of a hard mask layer 14A and a conductive layer 13A, and the cell transistor may include pillars having a stack structure of first to third silicon layers 11A, 12A, and 10B, and word lines (not illustrated) formed at sidewalls of the pillars.

Spacers 15A may be formed at the sidewalls of the bit lines BL and the first and second silicon layers 11A and 12A, storage node contacts 22 and storage nodes 23 may be formed on the pillars, and the circuit part and the cell part may be connected to each other through contacts 20.

The first to third silicon layers 11A, 12A, and 10B may be doped with first to third conductive impurities, wherein the first conductive impurity may include a conductive impurity substantially equal to the third conductive impurity. The first to third silicon layers 11A, 12A, and 10B serve as channels and junction regions of the word line. That is, the second and third silicon layers 12A and 105 serve as source/drain regions of the word line and the first silicon layer 11A serves as a channel region of the word line.

For example, the second and third silicon layers 12A and 10B may be an N-type silicon layer and the first silicon layer 11A may be a P-type silicon layer. Alternatively, the second and third silicon layers 12A and 108 may be a P-type silicon layer and the first silicon layer 11A may be an N-type silicon layer.

As described above, in accordance with the present embodiment, parasitic capacitance between the bit lines may be reduced by forming the air gap 18 between the bit lines. Furthermore, the second silicon layer 12A serving as the junction region is connected to the bit line BL, so that a process of forming a via or a contact plug for connecting the bit line BL to the cell transistor may be omitted.

FIG. 2A to FIG. 2H are sectional views illustrating the procedure for fabricating a second semiconductor wafer in accordance with the present embodiment. For the purpose of convenience, the same reference numerals as those of the second semiconductor wafer of FIG. 1 will be used.

Figure 2A:
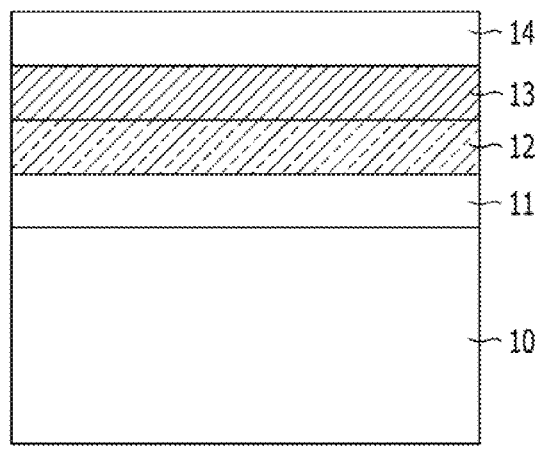
FIG. 2A to FIG. 2H are sectional views illustrating the procedure for fabricating a second semiconductor wafer in accordance with the present embodiment.

As illustrated in FIG. 2A, on a second semiconductor substrate 10 to be used as a donor wafer for forming a semiconductor device, a first silicon layer 11, a second silicon layer 12, a conductive layer 13, and a hard mask layer 14 are stacked.

The second semiconductor substrate 10 includes a single crystalline material. The second semiconductor substrate 10 includes a silicon-containing material, such as single crystalline silicon.

The first silicon layer 11 and the second silicon layer 12 serve as a channel and a junction region in a subsequent process and may include a silicon layer doped with a conductive impurity. The first silicon layer 11 and the second silicon layer 12 may include silicon layers doped with a first conductive impurity and a second conductive impurity, respectively. For example, the first conductive impurity may include a P-type impurity and the second conductive impurity may include an N-type impurity. That is, the first silicon layer 11 doped with the first conductive impurity may include the P-type impurity and the second silicon layer 12 doped with the second conductive impurity may include the N-type impurity. At this time, the P-type impurity may include Boron (B) and the like and the N-type impurity may include Phosphorous (P) arsenic (As) and the like.

The first silicon layer 11 and the second silicon layer 12 may be formed in the second semiconductor substrate 10, or formed over the second semiconductor substrate 10. For example, the first silicon layer 11 and the second silicon layer 12 may be formed by implanting ions into the second semiconductor substrate 10, or formed over the second semiconductor substrate 10 through epitaxial growth. When the first silicon layer 11 and the second silicon layer 12 are formed on the second semiconductor substrate 10, the first silicon layer 11 and the second silicon layer 12 may be doped with the first or second conductive impurity in-situ in an epitaxial growth process.

The first and second silicon layers 11 and 12 may serve as the channel and the junction region of the word line after a subsequent bonding process, and at least three silicon layers may need to be stacked to form the channel and the junction region of the word line. However, in the present embodiment, only the first and second silicon layers 11 and 12 are first formed, so that the degree of process difficulty may be alleviated, and particularly to ensure the reliability of elements, because it is possible to form silicon layers, among which the boundaries are clear, as compared with the case of forming three or more conductive silicon layers through ion implantation.

The conductive layer 13 is to be used as an electrode interconnection and may include a stack structure. For example, the conductive layer 13 may include a stack structure of a metal-containing layer, a barrier layer, and a metal electrode layer. The metal-containing layer is for low contact resistance, and may include a metal interconnection layer or a metal silicide layer. For example, the metal containing layer may include one metal interconnection layer selected from the group consisting of a titanium layer Ti, a cobalt layer Co, and a nickel layer Ni. The barrier layer is for suppressing reaction and may include a metal nitride layer. For example, the barrier layer may include one selected from the group consisting of a titanium nitride layer TiN, a tungsten nitride layer WN, a tantalum nitride layer TaN, a titanium silicide nitride layer TiSiN a tungsten silicide nitride layer WSiN, and a titanium silicide nitride layer TaSiN. The metal electrode layer may include a metal having a low resistance, and for example, may include one selected from the group consisting of a tungsten layer W, a copper layer Cu, a silver layer Au, and an aluminum layer Al.

The hard mask layer 14 is for substantially preventing oxidation of the conductive layer 13. The hard mask layer 14 is used as a lower layer etch and bit line hard mask, and may include an insulation layer. The insulation layer, for example, may include a nitride layer, wherein the nitride layer may include a silicide nitride layer SiN.

Figure 2B:
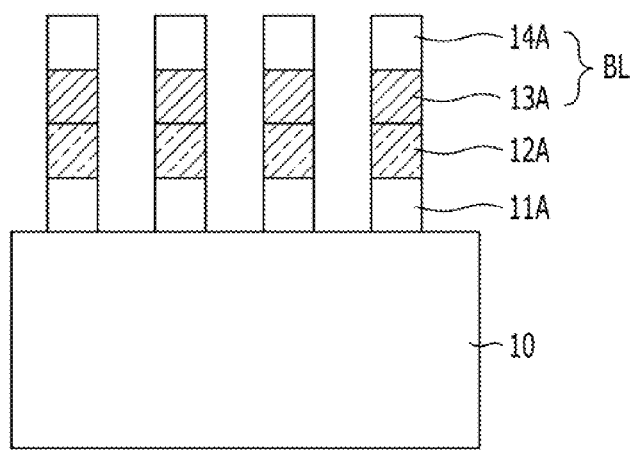

As illustrated in FIG. 2B, the hard mask layer 14, the conductive layer 13, the second silicon layer 12, and the first silicon layer 11 are patterned. First, a mask pattern (not illustrated) may be formed on the hard mask layer 14, the hard mask layer 14 may be etched using the mask pattern as an etch barrier, and a lower layer may be etched using the etched hard mask layer 14 as an etch barrier. The mask pattern may be formed by coating a photoresist layer on the hard mask layer 14 and patterning the photoresist layer through exposure and development.

Reference numerals 11A, 12A, 13A, and 14A indicate etched first silicon layer, second silicon layer, conductive layer, hard mask layer, respectively.

The etched first silicon layer 11A and second silicon layer 12A serve as a channel and a junction region of a word line and the etched conductive layer 13A and hard mask layer 14A serve as a bit line BL in a subsequent process.

Figure 2C:
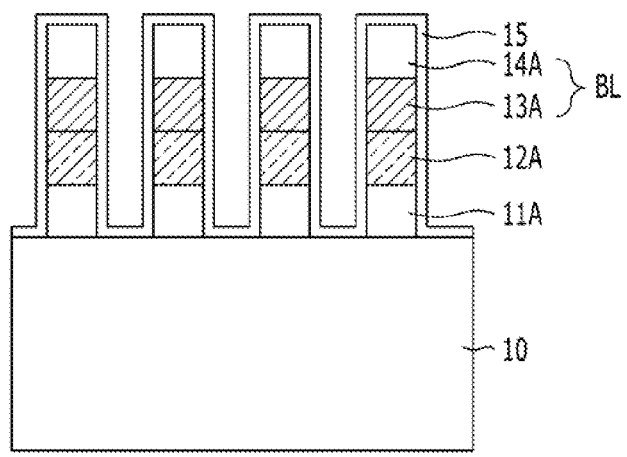

As illustrated in FIG. 2C, a spacer insulation layer 15 is formed over a resulting structure including the second semiconductor substrate 10 including the bit line BL.

The spacer insulation layer 15 protects the sidewall of the bit line BL and substantially prevents side oxidation of the conductive layer 13A. Furthermore, the spacer insulation layer 15 is also used as an etch mask for etching the second semiconductor substrate 10.

The spacer insulation layer 15 may be formed using a material having etching selectivity with respect to the second semiconductor substrate 10. For example, the spacer insulation layer 15 may include a nitride layer, wherein the nitride layer may be a silicon nitride layer.

Figure 2D:
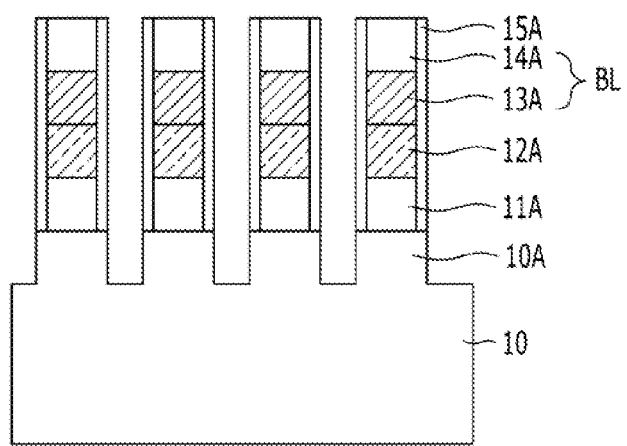

As illustrated in FIG. 2D, the second semiconductor substrate 10 is etched by a given depth using the spacer insulation layer 15 as an etch barrier. Thus, a predetermined thickness of the second semiconductor substrate 10 is formed in the form of a pillar below the bit line BL. A pillar-shaped semiconductor substrate 10A is used as a junction region in a subsequent process, so that an etch thickness in consideration of the semiconductor substrate 10A may be adjusted.

At this time, an upper portion of the hard mask layer 14A and an upper portion of the second semiconductor substrate 10 are also removed, and as a result, a spacer 15A is formed at the sidewalls of the first and second silicon layers 11A and 12A and the bit line BL.

The pillar-shaped semiconductor substrate 10A is used as a channel and a junction region of a subsequent word line together with the first and second silicon layers 11A and 12A, and will be referred to as a "third silicon layer 10B" below.

Figure 2E:
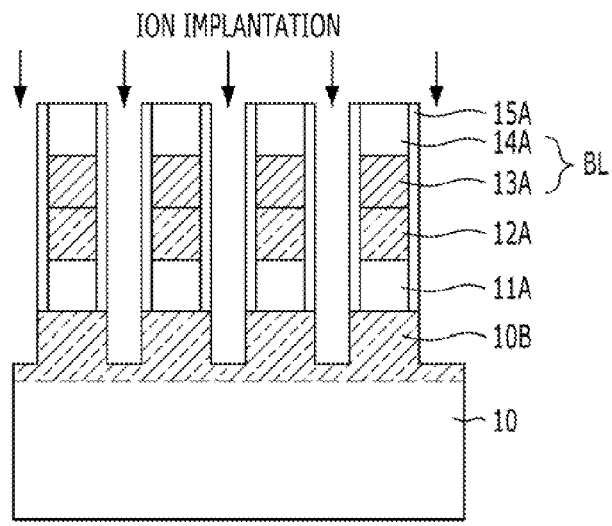

As illustrated in FIG. 2E, a third conductive impurity is implanted into the third silicon layer 10B and the second semiconductor substrate 10. The third conductive impurity may include a conductive impurity substantially equal to the second conductive impurity. For example, when the second conductive impurity is an N-type impurity, the third conductive impurity may also include the N-type impurity.

Figure 2F:
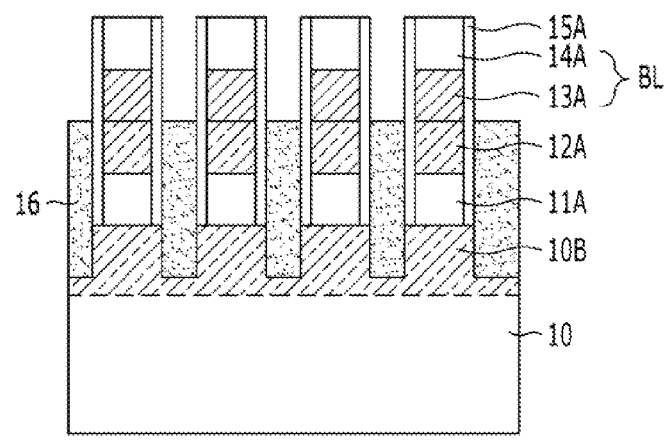

As illustrated in FIG. 2F, a first insulation layer 16 is formed on the second semiconductor substrate 10 to fill among the first to third silicon layers 11A, 12A, and 10B. The first insulation layer 16 may include a flexible insulation layer such that gap fill is possible even in a narrow region. For example, the first insulation layer 16 may include an oxide layer.

In order to form the first insulation layer 16 to fill among the first to third silicon layers 11A, 12A, and 10B, it is possible to perform a process for forming an insulation layer that fills gaps between the first to third silicon layers 11A, 12A, and 10B and the bit line BL, which protrude from the upper portion of the second semiconductor substrate 10, and recessing the insulation layer such that the bit line BL protrudes from the upper portion of the insulation layer.

Figure 2G:
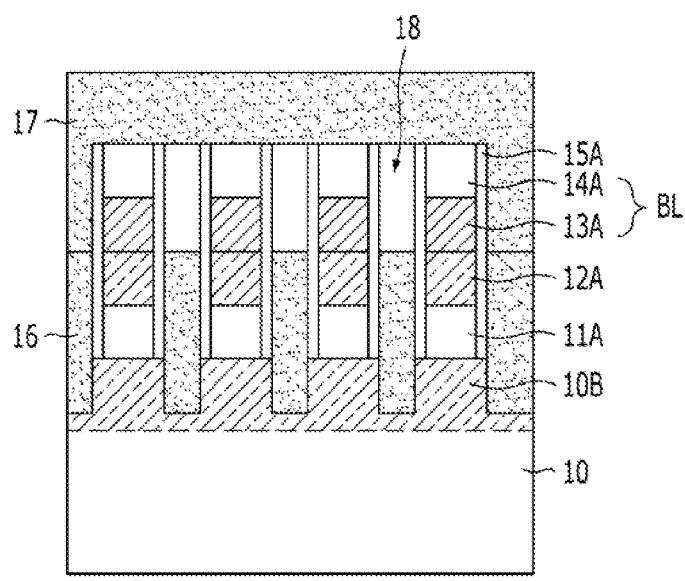

As illustrated in FIG. 2G, a second insulation layer 17 is formed on the first insulation layer 16. Particularly, the second insulation layer 17 is formed under the condition that an air gap 18 is formed between the bit lines BL.

To this end, the second insulation layer 17 may be formed using a deposition method having low step coverage. For example, the second insulation layer 17 may be formed through chemical vapor deposition.

Furthermore, the second insulation layer 17 may be used as a boding layer, and for example, may include an oxidation layer. In another embodiment, a second boding layer (not illustrated) may be formed on the second insulation layer 17.

As described above, the first to third silicon layers 11A, 12A, and 10B are filled with the flexible first insulation layer 16, and the second insulation layer 17 is formed on the first insulation layer 16 through the chemical vapor deposition, so that the air gap 18 between the bit lines BL may be formed. Consequently, the parasitic capacitance between the bit lines may be reduced.

Figure 2H:
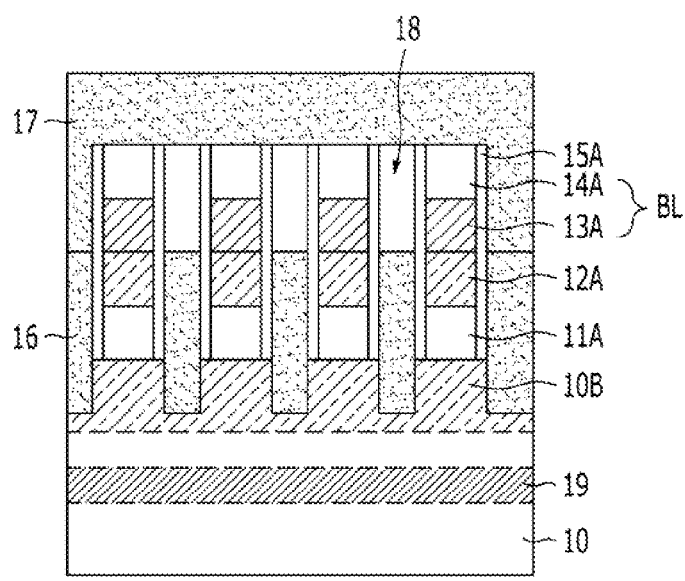

As illustrated in FIG. 2H, a separation layer 19 may be formed in the second semiconductor substrate 10 at a given depth. The separation layer 19 is for facilitating a cleaving process after subsequent wafer bonding, and may be formed by implanting hydrogen ions into the second semiconductor substrate 10 by a given depth.

FIG. 3A to FIG. 3E are sectional views illustrating the procedure for fabricating a semiconductor device in accordance with the present embodiment.

Figure 3A:
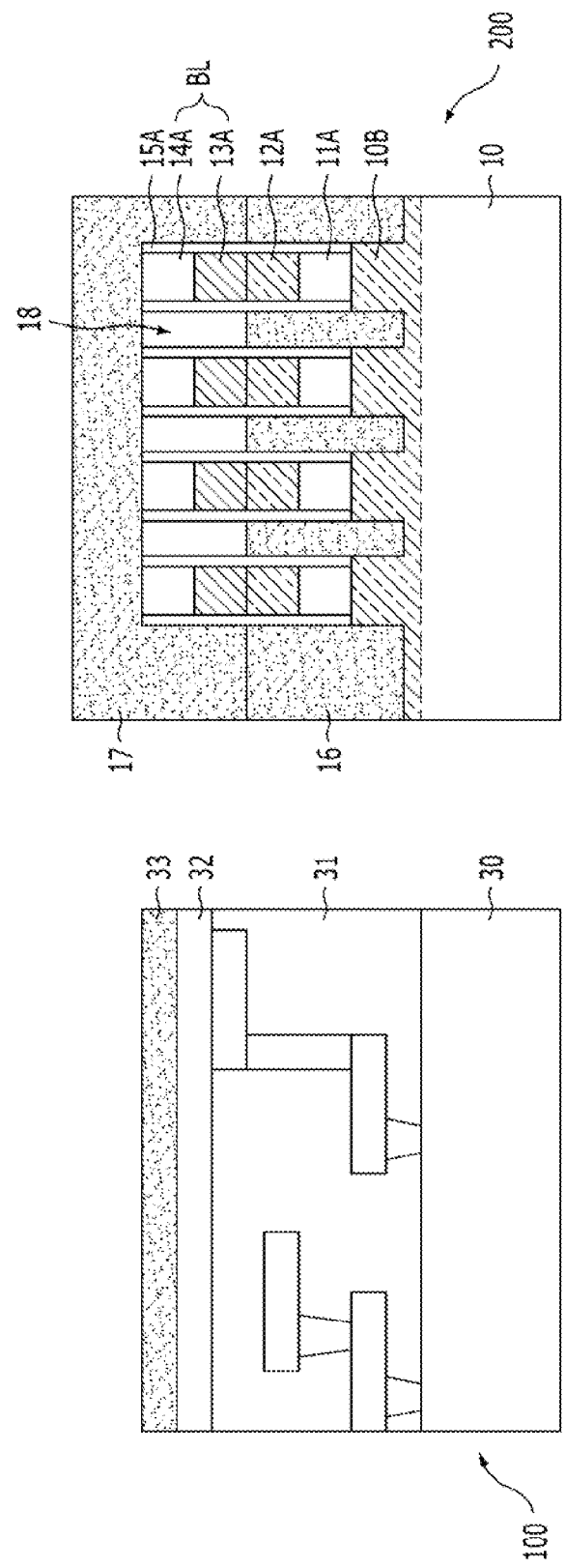
FIG. 3A to FIG. 3E are sectional views illustrating the procedure for fabricating a semiconductor device in accordance with the present embodiment.

As illustrated in FIG. 3A, a first semiconductor wafer 100 and a second semiconductor wafer 200 for forming the semiconductor device are prepared. The first semiconductor wafer 100 is an acceptor wafer in which semiconductor elements are formed, and the second semiconductor wafer 200 is a donor wafer to be bonded to the first semiconductor wafer 100. The first semiconductor wafer 100 may serve as a circuit part including interconnections and the like, and the second semiconductor wafer 200 may serve as a cell part in which elements are formed.

The first semiconductor wafer 100 may include a substrate for forming a MOS-FET, a DRAM, a SRAM, a PRAM, or a flash memory.

A first semiconductor substrate 30 may include bulk silicon, bulk silicon-germanium, or a semiconductor substrate in which a silicon or silicon-germanium epitaxial layer is formed on the bulk silicon or the bulk silicon-germanium. Furthermore, the first semiconductor substrate 30 may include one semiconductor structure selected from the group that includes silicon-on-sapphire (SOS), silicon-on-insulator (SOI), a thin film transistor (TFT), doped semiconductors, undoped semiconductors, and a silicon epitaxial layer supported by a substrate semiconductor.

The first semiconductor substrate 30 may further include a well, an isolation layer, a gate, a source/drain, a plurality of contacts, and an insulation layer 31 including an interconnection. Although not illustrated in the drawings, the first semiconductor substrate 30 may further include a peripheral circuit part and an interconnection.

First bonding layers 32 and 33 are formed on the first semiconductor substrate 30. The first bonding layers 32 and 3 are to be bonded to the second semiconductor wafer 200, and may include a structure in which heterogeneous layers is stacked. The first bonding layers 32 and 33, for example, may include a stack structure of the nitride layer 32 and the oxide layer 33. The nitride layer 32 may include a silicon nitride layer and the oxide layer 33 may include a silicon oxide layer.

A channel for a vertical gate, a junction region, and a bit line BL are formed on the second semiconductor substrate 10 of the second semiconductor wafer 200, which is to be used as a donor wafer. The second semiconductor substrate 10 may be a substrate for which predetermined processes are completed, and for example, may include a silicon substrate. The second semiconductor wafer 200 is formed through the processes of FIG. 2A to FIG. 2H.

In the present embodiment, the second insulation layer 17 is employed as a second bonding layer and a bonding process is performed on the first bonding layers 32 and 33 and the second insulation layer 17.

Figure 3B:
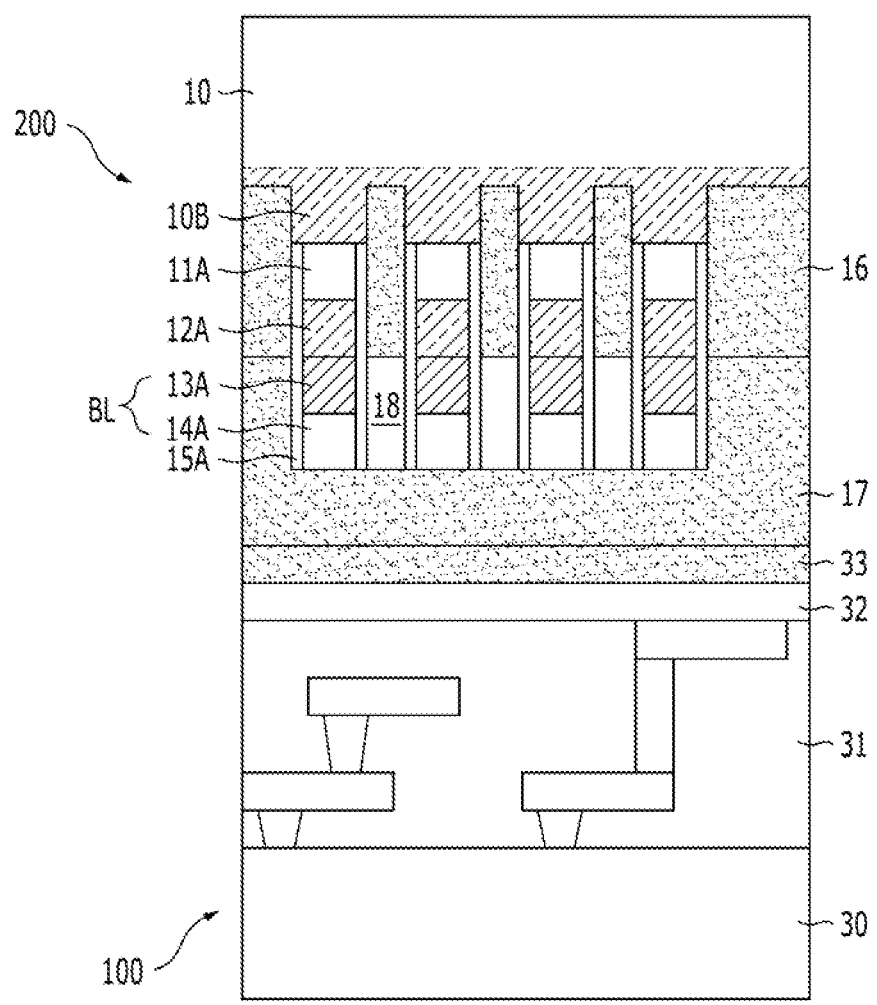

As illustrated in FIG. 3B, the first and second semiconductor wafers 100 and 200 are bonded to each other using the first bonding layers 32 and 33 and the second insulation layer 17. The bonding of the first and second semiconductor wafers 100 and 200 is oxide-to-oxide bonding, and may be performed based on the Van der Waals force.

In order to improve bonding strength, heat treatment may be performed in batch-type equipment. At this time, predetermined pressure may also be simultaneously applied along with the heat treatment.

Figure 3C:
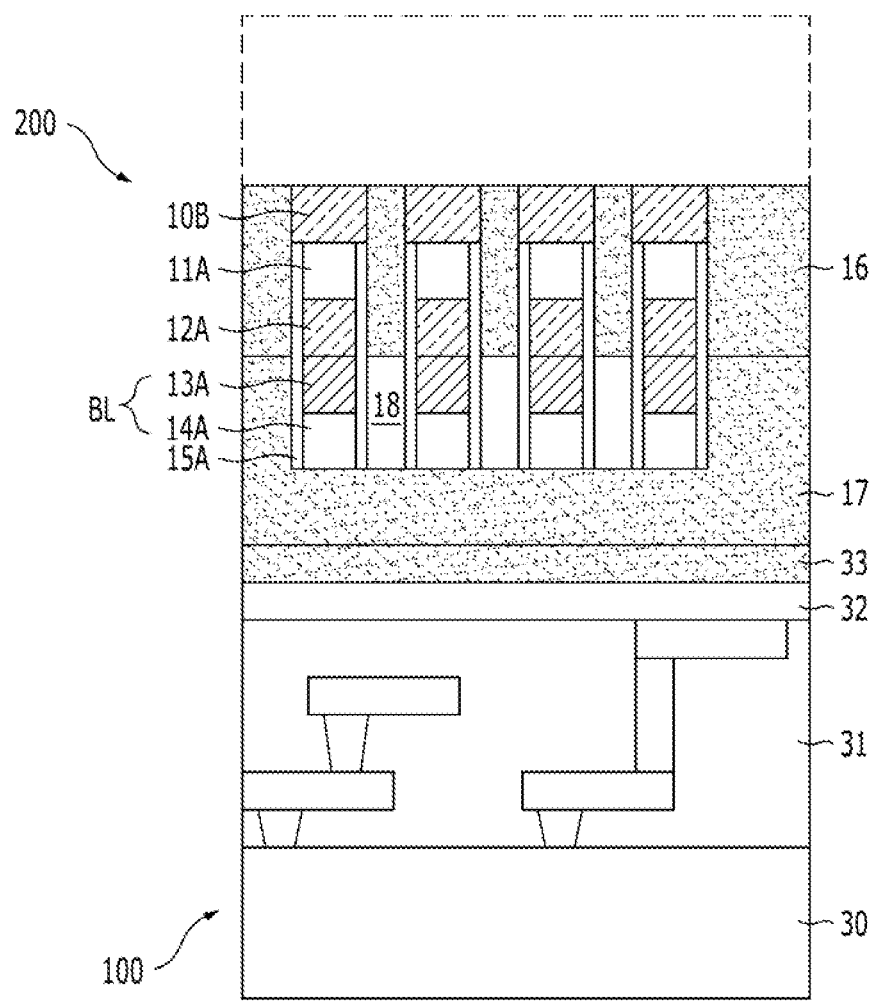

As illustrated in FIG. 3C, a separation process is performed for the second semiconductor substrate 10 (refer to FIG. 3B) of the bonded second semiconductor wafer 200.

The separation process may be performed by grinding, polishing, or etching the upper surface of the second semiconductor substrate 10 (refer to FIG. 3B). Alternatively, when the separation layer 19 (refer to FIG. 2H) is formed in the second semiconductor substrate 10 through hydrogen ion implantation, the grinding, polishing, or etching process may be performed until the separation layer is exposed. In the case of employing the separation layer, a remaining second semiconductor substrate 10 (refer to FIG. 3B) is planarized by performing an anisotropic etching process or an isotropic etching process after the separation layer is exposed. Thus, the third silicon layer 108 and the first insulation layer 16 are exposed.

Figure 3D:
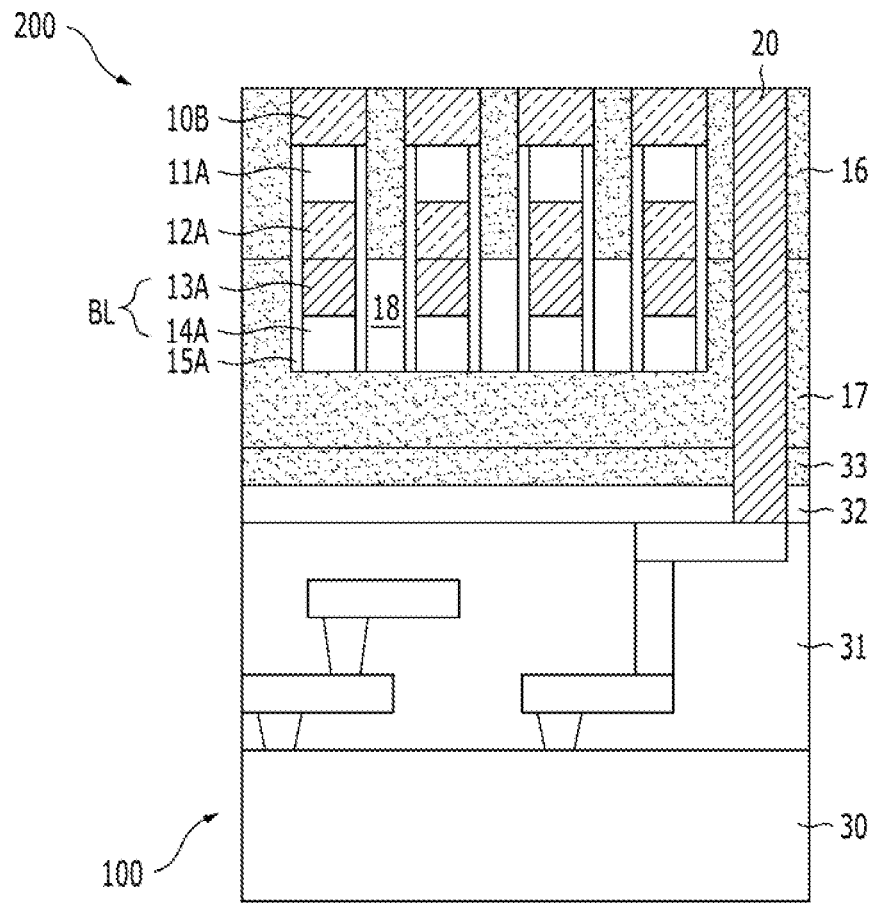

As illustrated in FIG. 3D, a word line (not illustrated), which uses the first to third silicon layers 11A, 12A, and 10B as a channel and a junction region, is formed. At this time, the second and third silicon layers 12A and 10B may serve as the junction region of the word line and the first silicon layer 11A may serve as the vertical channel of the word line. That is, the second silicon layer 12A may serve as a source region of the word line and the third silicon layer 10B may serve as a drain region of the word line. Furthermore, the word line may be formed at the sidewall of the first silicon layer 111 while surrounding the first silicon layer 11A.

A contact 20 is formed to pass through the first and second insulation layers 16 and 17. Through the contact 20 the bit line BL and the word line may be connected to semiconductor elements positioned above the first semiconductor substrate 30.

Figure 3E:
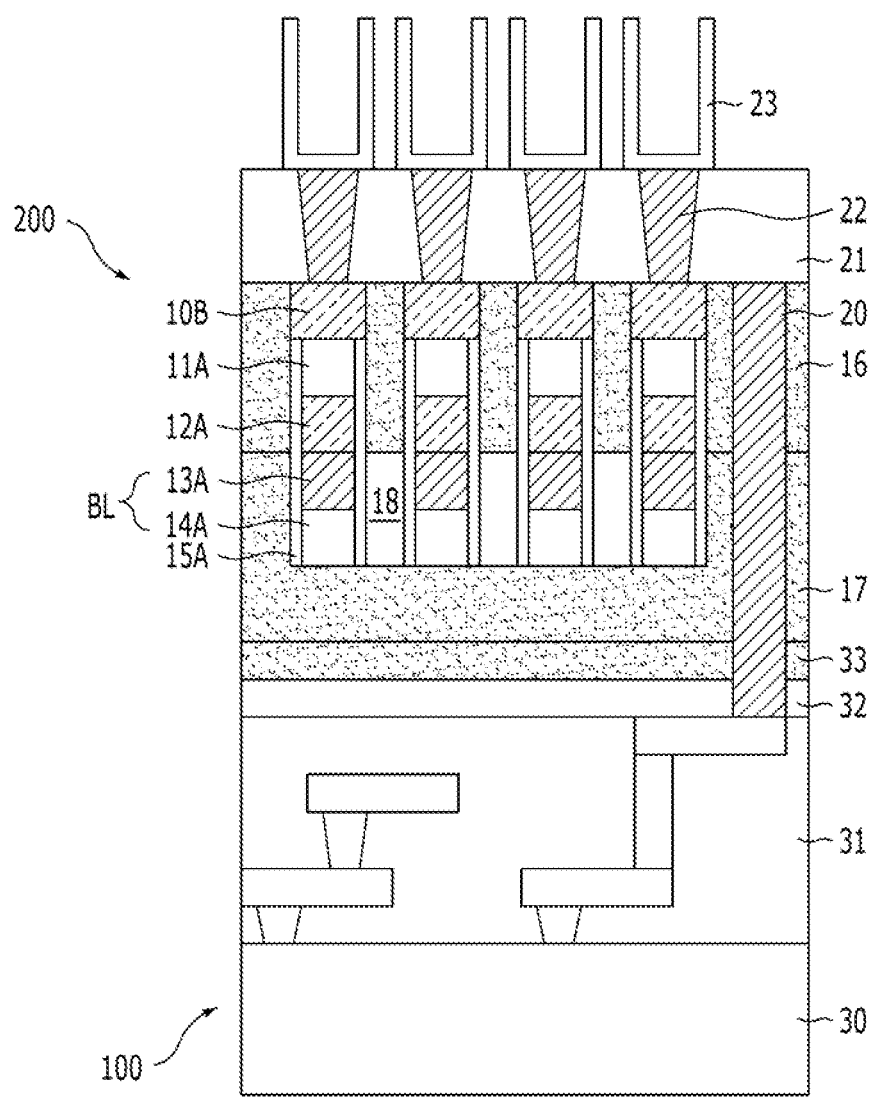

As illustrated in FIG. 3E, a third insulation layer 21 is formed on the contact 20 and the first insulation layer 16 including the third silicon layer 10B serving as the drain region. The third insulation layer 21, for example, may include an oxide layer.

Storage node contacts 22 are formed to be connected to the third silicon layer 10B by passing through the third insulation layer 21.

Storage nodes 23 are formed to be connected to the storage node contacts 22. In the present embodiment, the cylinder-type storage node is illustrated. However, the present invention is not limited thereto. For example, the present invention may include all types of storage nodes which may be formed.

According to the present invention, when a conductive silicon layer for forming elements is formed, a stack structure may be improved, the degree of process difficulty may be reduced.

Furthermore, an air gap is formed between bit lines to reduce parasitic capacitance between the bit lines so that the reliability of elements may be ensured.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:

forming a first semiconductor wafer, in which a circuit part and a first bonding layer are stacked, on a first semiconductor substrate;

forming a second semiconductor wafer, which includes structures and an insulating layer for gap-filling between the structures, on a second semiconductor substrate, the structures including a pillar and bit lines stacked therein;

bonding the first semiconductor wafer with the second semiconductor wafer so that the first bonding layer faces the insulating layer; and separating the second semiconductor substrate from the bonded second semiconductor wafer, wherein, in the forming of the second semiconductor wafer, forming of the structures including the pillar and the bit lines stacked therein comprises:

stacking a first silicon layer and a second silicon layer on the second semiconductor substrate;

stacking a conductive layer and a hard mask layer on the second silicon layer;

forming the bit lines by etching the hard mask layer and the conductive layer;

etching the second silicon layer and the first silicon layer below the bit lines;

forming a spacer at sidewalls of the etched second silicon layer, the etched first silicon layer and the bit lines;

etching the second semiconductor substrate by a predetermined depth using the spacer as an etch barrier; and forming a third silicon layer by implanting ions into the etched second semiconductor substrate.

2. The method of claim 1, wherein, in the forming of the second semiconductor wafer, forming of the insulating layer comprises:

forming a first insulating layer on the second semiconductor substrate to gap-fill between the structures including the pillar and the bit lines stacked therein;

recessing the first insulating layer by a predetermined depth and allowing the bit lines to protrude; and forming a second insulating layer on the first insulating layer to form an air gap between the bit lines.

3. The method of claim 1, wherein the first to third silicon layers include a silicon layer doped with a conductive impurity.

4. The method of claim 1, wherein the second and third silicon layers include an N type silicon layer and the first silicon layer includes a P-type silicon layer.

5. The method of claim 1, wherein the second and third silicon layers include a P-type silicon layer and the first silicon layer includes an N-type silicon layer.

6. The method of claim 1, wherein the forming of the first silicon layer and the second silicon layer includes implanting respective conductive impurities into the second semiconductor substrate.

7. The method of claim 1, wherein the forming of the first silicon layer and the second silicon layer includes performing epitaxial growth process to form the first silicon layer and the second silicon layer.

8. The method of claim 7, wherein, the forming of the first silicon layer and the second silicon layer includes doping respective conductive impurities in-situ in the epitaxial growth process.

9. The method of claim 1, wherein the spacer includes a nitride layer.

10. The method of claim 2, wherein the first and second insulation layers include an oxide layer.

11. The method of claim 3, wherein the second insulation layer is formed through a chemical vapor deposition.

12. The method of claim 1, wherein the forming of the second semiconductor wafer further comprises:
    forming a second bonding layer on the insulation layer.

13. The method of claim 1, wherein the forming of the second semiconductor wafer further comprises:
    forming a separation layer in a lower portion of the second semiconductor substrate.

14. The method of claim 13, wherein the forming of the separation layer includes implanting a hydrogen ion into the lower portion of the second semiconductor substrate at a given depth.

15. The method of claim 1, further comprising:
    forming a word line on the bit line after the separating of the second semiconductor substrate from the second semiconductor wafer; and
    forming a capacitor on the word line.

\* \* \* \* \*